United States Patent
Yoshida et al.

(10) Patent No.: US 9,406,571 B2
(45) Date of Patent: Aug. 2, 2016

(54) METHOD FOR MANUFACTURING SEMICONDUCTOR DEVICE INCLUDING INLINE INSPECTION

(71) Applicant: Mitsubishi Electric Corporation, Tokyo (JP)

(72) Inventors: Takuya Yoshida, Fukuoka (JP); Kazutoyo Takano, Fukuoka (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 2 days.

(21) Appl. No.: 14/486,221

(22) Filed: Sep. 15, 2014

(65) Prior Publication Data

US 2015/0221564 A1    Aug. 6, 2015

(30) Foreign Application Priority Data

Jan. 31, 2014    (JP) .................................. 2014-017218

(51) Int. Cl.
*H01L 21/66* (2006.01)
*H01L 21/78* (2006.01)
*H01L 21/304* (2006.01)

(52) U.S. Cl.
CPC ............ *H01L 22/14* (2013.01); *H01L 21/3043* (2013.01); *H01L 21/78* (2013.01); *H01L 22/20* (2013.01); *H01L 22/34* (2013.01)

(58) Field of Classification Search
CPC ......... H01L 22/14; H01L 21/78; H01L 22/20; H01L 22/34; H01L 21/3043
See application file for complete search history.

(56) References Cited

U.S. PATENT DOCUMENTS

| 4,100,486 A | * | 7/1978 | Casowitz | ........... G01R 31/2637 257/E21.531 |
| 2007/0111340 A1 | * | 5/2007 | Goldberger | ............. H01L 22/14 438/17 |
| 2009/0255818 A1 | * | 10/2009 | Basker | ..................... C25D 5/10 205/83 |

FOREIGN PATENT DOCUMENTS

| JP | S62-261139 A | 11/1987 |
| JP | H03-050732 A | 3/1991 |
| JP | H09-213759 A | 8/1997 |
| JP | H09-321103 A | 12/1997 |
| JP | 2001-308036 A | 11/2001 |
| JP | 2013-171897 A | 9/2013 |

* cited by examiner

*Primary Examiner* — Laura Menz
*Assistant Examiner* — Candice Y Chan
(74) *Attorney, Agent, or Firm* — Studebaker & Brackett PC

(57) ABSTRACT

A method for manufacturing a semiconductor device includes: forming a semiconductor wafer including a plurality of semiconductor devices sandwiching a dicing region and an inline inspection monitor arranged in the dicing region; after forming the semiconductor wafer, conducting an inline inspection of the semiconductor device by using the inline inspection monitor; and after the inline inspection, dicing the semiconductor wafer along the dicing region to separate the semiconductor devices individually. The step of forming the semiconductor wafer includes: simultaneously forming a first diffusion layer of the semiconductor device and a second diffusion layer of the inline inspection monitor; forming a metal layer on the first and second diffusion layer; and at least partly removing the metal layer on the second diffusion layer. When the semiconductor wafer is diced, a portion from which the metal layer has been removed is cut by a dicing blade on the second diffusion layer.

5 Claims, 13 Drawing Sheets

METHOD FOR MANUFACTURING SEMICONDUCTOR DEVICE INCLUDING INLINE INSPECTION

BACKGROUND OF THE INVENTION

1. Field of the Invention

The present invention relates to a method for manufacturing a semiconductor device wherein defect of withstand voltage deterioration caused by chipping or cracks from the dicing region side can be reduced and there is no need to apply etching removal of the measurement electrode after the inline inspection.

2. Background Art

A power semiconductor device such as an IGBT (Insulated Gate Bipolar Transistor), diode, power MOSFET (Metal-Oxide-Semiconductor Field-Effect Transistor) and the like is a semiconductor device controlling large electric power unlike the other semiconductor devices such as a memory, a microcomputer and the like. In these power semiconductor devices, reduction of a power loss which is a sum of a steady loss in a device ON state and a switching loss at switching is in demand. In response to that, optimization of a device design dimension in silicon has been meeting the market request.

As a surface electrode of the power semiconductor device, a thick film electrode having a thickness of 1.0 µm or more is made of aluminum. This is to prevent an increase in the steady loss caused by spreading resistance of an electrode portion during a large-current operation. Moreover, a thin film barrier metal (TiN, TiW and the like) is formed under the aluminum similarly to the memory, the microcomputer and the like. As a result, diffusion of aluminum over the silicon surface is prevented, and diffusion of silicon into aluminum is prevented. Moreover, by forming a silicide layer, contact resistance between the electrode and the silicon is reduced, and variation of the contact resistance is reduced and made stable.

At the same time as the surface electrode of the power semiconductor device, a surface electrode for an inline inspection monitor arranged on a dicing region is also formed. The inline inspection monitor is an inspection pattern for inspecting whether or not a device pattern is being normally formed in a production line. Abnormality in a production process is detected by making film thickness measurement or dimension measurement in middle processes during a wafer process. Moreover, by feeding back a result to a production condition depending on the case, stable production with reduced variations in manufacture is realized.

In addition, there is an inline inspection monitor for measuring sheet resistance, contact resistance, inverted voltage or the like of an impurity diffusion layer of a P type semiconductor and an N type semiconductor in silicon after completion of the wafer process. These inline inspection monitors are not formed in a power chip region used as a product but are formed in an ineffective region such as a dicing region, a wafer outer periphery or the like.

The surface electrode of the power semiconductor and an electrode of the inline inspection monitor measurement are formed at the same time. Since aluminum in the surface electrode of the power semiconductor device is a thick film of 1.0 µm or more, aluminum of the monitor measurement electrode is also formed as a thick film. Since the monitor is located on the dicing region, during a dicing process, thick film aluminum of the monitor measurement electrode needs to be cut at the same time as silicon or an oxide film to be diced. In the dicing using a general dicing blade, a wafer is cut by cutting work using a dicing blade rotating at a high speed. However, since soft and highly ductile aluminum has poor cutting performance, biting of aluminum into an uneven part of the dicing blade can easily occur depending on the pressure of the dicing blade during dicing. The bitten aluminum gives a local stress different from original dicing to silicon in irregularity on a silicon cut surface by means of rotation of the dicing blade, and chipping (chips) or cracking (cracks) might be caused in silicon. If the chipping and cracks reach a withstand-voltage holding part of an edge termination portion in a power chip, it causes withstand voltage failure in a final product inspection process (final test) conducted in a last process of power module assembling, which might deteriorate a yield.

Thus, in order to suppress chipping or cracks caused by dicing, a manufacturing method is proposed (see Japanese Patent-Laid-Open No. 2001-308036, for example) in which only metal of the electrode for measuring the inline inspection monitor located on the dicing region is removed by etching treatment after inline inspection, and then, dicing is performed.

SUMMARY OF THE INVENTION

However, foreign substances from heavy metal contamination (Au, for example) from back-surface metal type or generated during contact of an inspection needle in inline inspection adhere to a wafer after the inline inspection. Since there are concerns in bringing such wafers into a wafer process line, an exclusive line becomes necessary. Moreover, there is a high step of an overcoat film (glass coating, polyimide and the like), whereby new problems in manufacture such as close contact of resist, etching residue and the like occur.

In view of the above-described problems, an object of the present invention is to provide a method for manufacturing a semiconductor device wherein defect of withstand voltage deterioration caused by chipping or cracks from the dicing region side can be reduced and there is no need to apply etching removal of the measurement electrode after the inline inspection.

According to the present invention, a method for manufacturing a semiconductor device includes: forming a semiconductor wafer including a plurality of semiconductor devices sandwiching a dicing region and an inline inspection monitor arranged in the dicing region; after forming the semiconductor wafer, conducting an inline inspection of the semiconductor device by using the inline inspection monitor; and after the inline inspection, dicing the semiconductor wafer along the dicing region to separate the semiconductor devices individually. The step of forming the semiconductor wafer includes: simultaneously forming a first diffusion layer of the semiconductor device and a second diffusion layer of the inline inspection monitor; forming a metal layer on the first and second diffusion layer; and at least partly removing the metal layer on the second diffusion layer. When the semiconductor wafer is diced, a portion from which the metal layer has been removed is cut by a dicing blade on the second diffusion layer.

In the present invention, in the step of forming the semiconductor wafer before the inline inspection, the metal layer on the second diffusion layer of the inline inspection monitor is at least partly removed. The portion from which the metal layer has been removed is cut by a dicing blade. As a result, biting of the aluminum layer into the dicing blade can be eliminated and thus, defect of withstand voltage deterioration caused by chipping or cracks from the dicing region side can be reduced. Moreover, since there is no need to apply etching removal of the measurement electrode after the inline inspection, the manufacturing process can be simple.

Other and further objects, features and advantages of the invention will appear more fully from the following description.

DETAILED DESCRIPTION OF THE PREFERRED EMBODIMENTS

A method for manufacturing a semiconductor device according to the embodiments of the present invention will be described with reference to the drawings. The same components will be denoted by the same symbols, and the repeated description thereof may be omitted.

Embodiment 1

Figure 1:
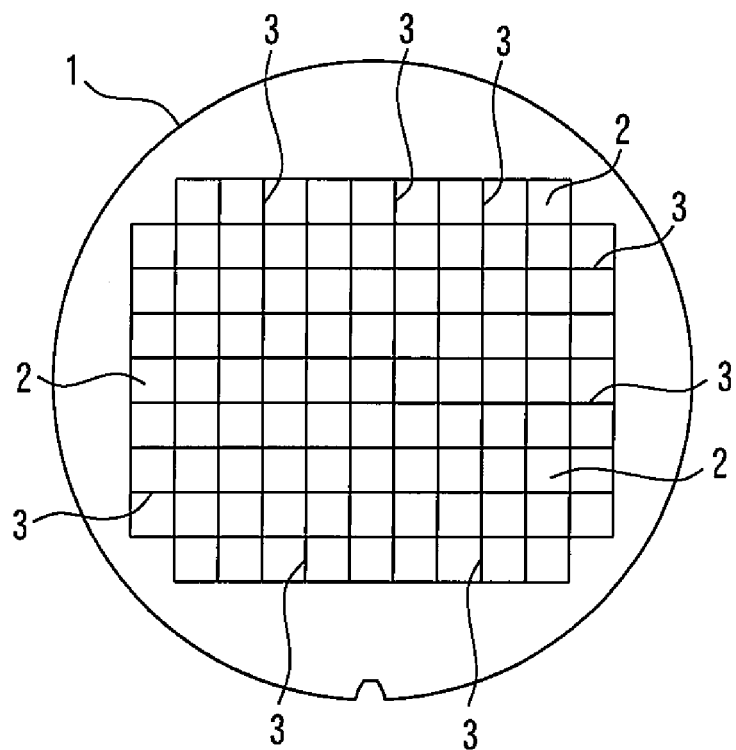
FIG. 1. is a top view illustrating a semiconductor wafer formed by a wafer process.

A manufacturing method of a semiconductor device according to Embodiment 1 of the present invention will be described by using the attached drawings. First, a semiconductor wafer 1 is formed by a wafer process as illustrated in FIG. 1. On this semiconductor wafer 1, a plurality of semiconductor devices 2 each having a planar square shape are arranged in a matrix state sandwiching a dicing region 3 between them.

Figure 2:
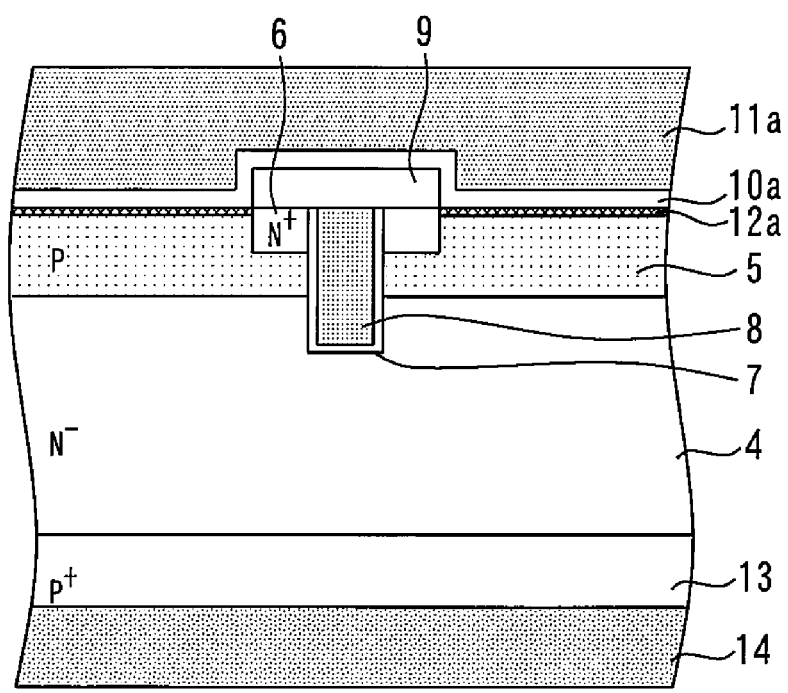
FIG. 2 is a sectional view illustrating the semiconductor device according to Embodiment 1 of the present invention.

FIG. 2 is a sectional view illustrating the semiconductor device according to Embodiment 1 of the present invention. The semiconductor device 2 is a power semiconductor device such as an IGBT, a diode, a power MOSFET and the like but here, an IGBT is described as an example.

A P type base layer 5 is formed on an N– type substrate 4. An N+ type emitter layer 6 is formed on a part of the P– type base layer 5. A gate electrode 8 is formed through a gate insulating film 7 in a trench penetrating this N+ type emitter layer 6 and the P type base layer 5. An inter-layer insulating film 9 is formed on the gate electrode 8. An emitter electrode 11a is formed on the P type base layer 5 through a barrier metal 10a. A silicide 12a is formed between the barrier metal 10a and the P type base layer 5.

A P+ type collector layer 13 and a collector electrode 14 are formed in order under an N– type substrate 4. In a normal semiconductor device, an overcoat film such as glass coating, polyimide and the like is formed in many cases, but since there is no relation to the invention of the present application, explanation will be omitted.

Figure 3:
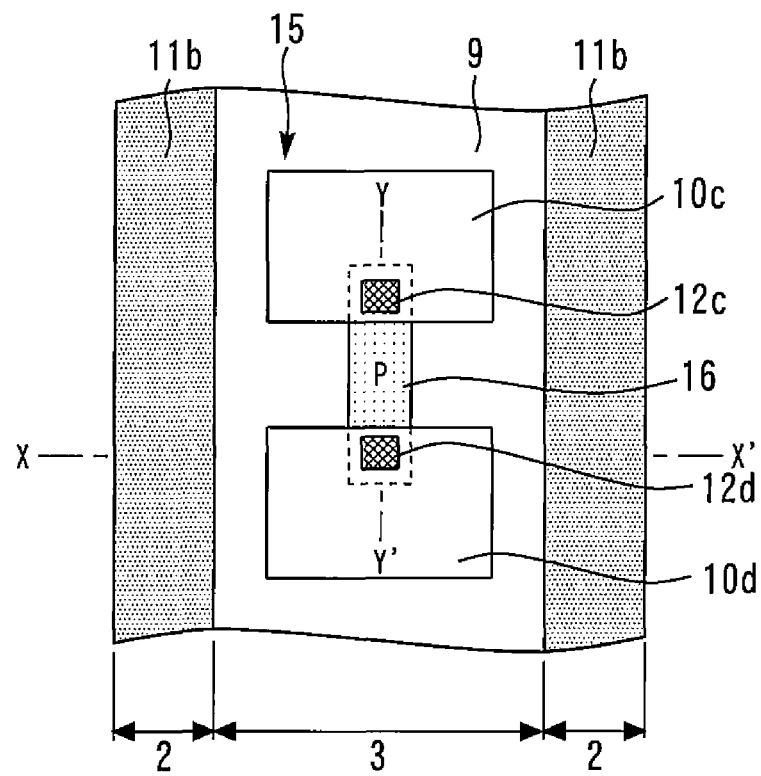
FIG. 3 is a top view illustrating an inline inspection monitor according to Embodiment 1 of the present invention.
Figure 4:
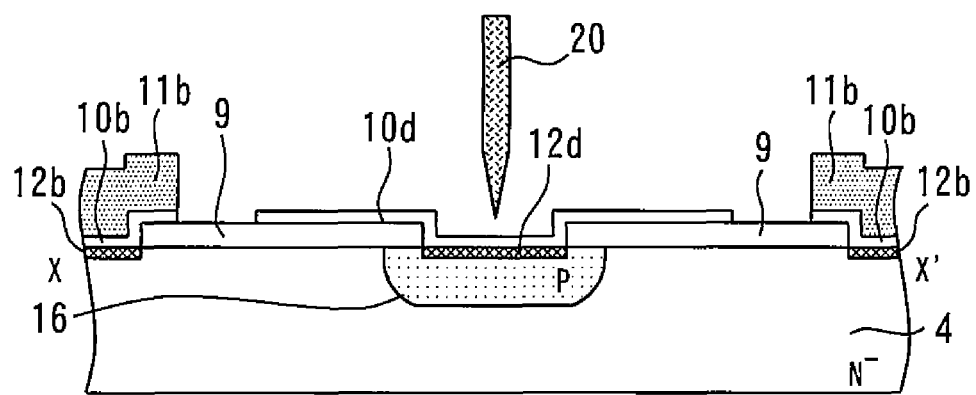
FIG. 4 is a sectional view along X-X' in FIG. 3.
Figure 5:
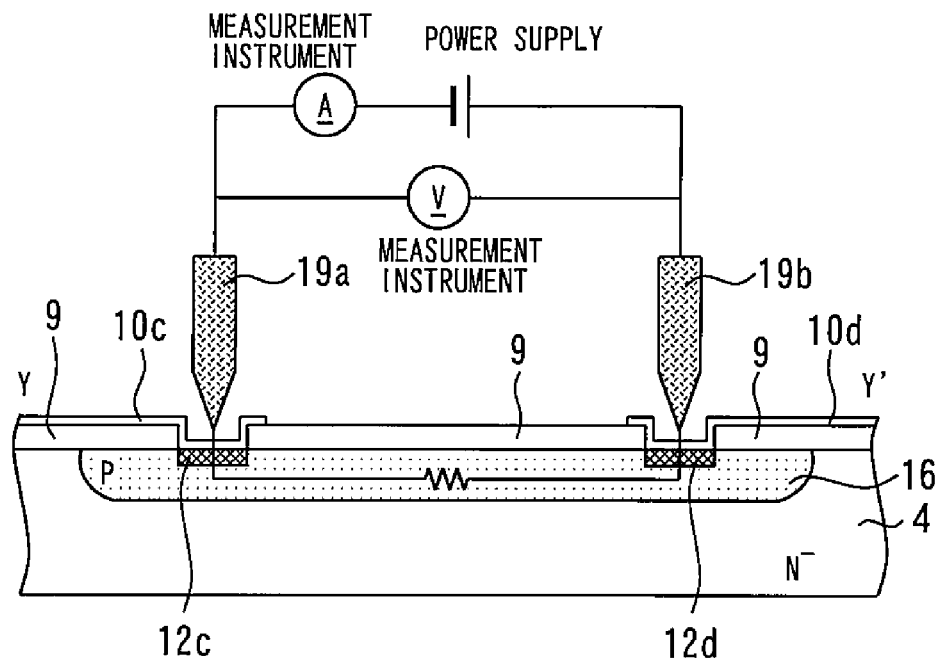
FIG. 5 is a sectional view along Y-Y' in FIG. 3.

FIG. 3 is a top view illustrating an inline inspection monitor according to Embodiment 1 of the present invention. FIG. 4 is a sectional view along X-X' in FIG. 3, and FIG. 5 is a sectional view along Y-Y' in FIG. 3. An inline inspection monitor 15 is arranged in the dicing region 3.

On the surface of the N– type substrate 4, a P type layer 16 is formed in the inline inspection monitor 15. On the surface of the N– type substrate 4, an inter-layer insulating film 9 is formed. In the inter-layer insulating film 9, a contact hole is formed on the P type layer 16.

In the semiconductor device 2, a barrier metal 10b is formed on the N– type substrate 4, and an aluminum electrode 11b is formed thereon. This aluminum electrode 11b is a channel stopper electrode on an edge termination end portion of the semiconductor device 2. Barrier metals 10c and 10d are formed on the P type layer 16 through the two contact holes, respectively. Silicides 12b, 12c, and 12d are formed under the barrier metals 10b, 10c, and 10d, respectively.

Figure 6:
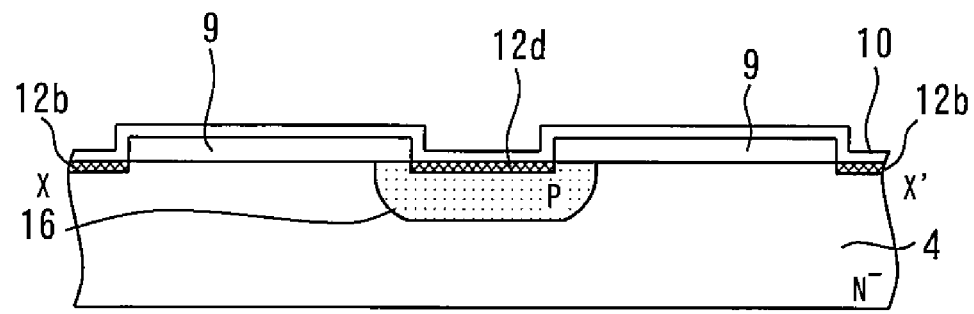
FIGS. 6 to 10 are sectional views illustrating a manufacturing process of the inline inspection monitor according to Embodiment 1 of the present invention.

FIGS. 6 to 10 are sectional views illustrating a manufacturing process of the inline inspection monitor according to Embodiment 1 of the present invention. These views correspond to a sectional view along X-X' in FIG. 3. First, as illustrated in FIG. 6, the P type layer 16 is formed on the N– type substrate 4. The P type layer 16 on this inline inspection monitor 15 is formed at the same time as the P type base layer 5 of the semiconductor device 2. Subsequently, the inter-layer insulating film 9 is formed, and a contact hole is formed in the inter-layer insulating film 9 above the edge termination end portion and the P type layer 16 of the semiconductor device 2. A barrier metal 10 is formed on the whole surface including the P type base layer 5 and the P type layer 16. The silicides 12c and 12d are formed between the P type layer 16 and the barrier metal 10 by RTA (Rapid Thermal Anneal) treatment. The silicides 12c and 12d of this inline inspection monitor 15 are formed at the same time as the silicides 12a and 12b of the semiconductor device 2.

Figure 7:
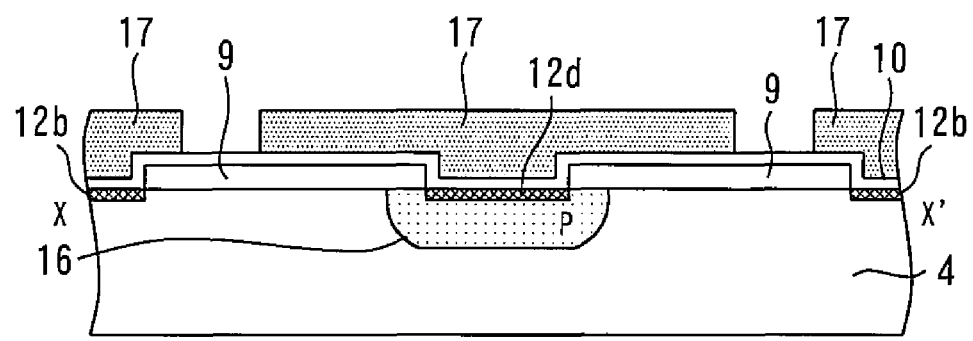
Figure 8:
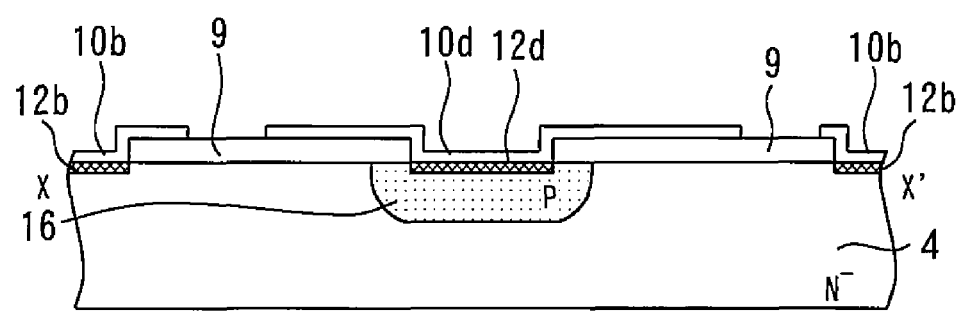

Subsequently, as illustrated in FIG. 7, a resist 17 is formed on the barrier metal 10 in a photolithography process. Subsequently, the barrier metal 10 is subjected to etching by using the resist 17 as a mask and separated into the barrier metals 10a to 10d as illustrated in FIG. 8. After that, the resist 17 is removed.

Figure 9:
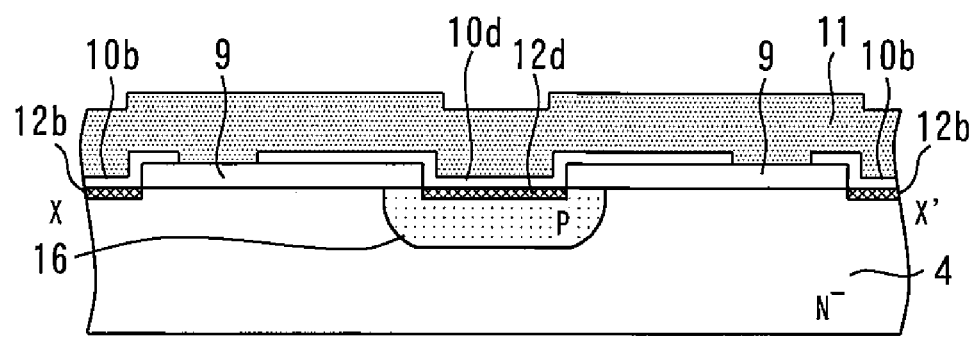
Figure 10:
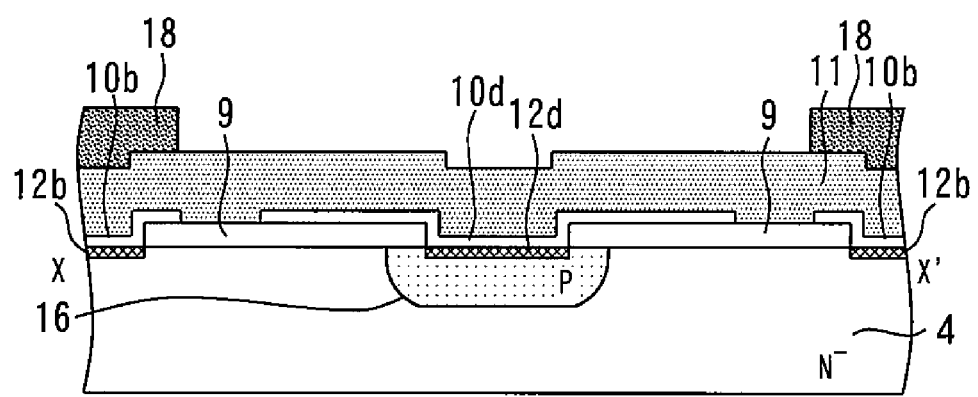

Subsequently, as illustrated in FIG. 9, an aluminum layer 11 is formed on the wafer surface. Subsequently, a resist 18 is formed on the barrier metal 10b. By using this resist 18 as a mask, the aluminum layer 11 on the P type layer 16 is removed. After that, the resist 18 is removed. As a result, the inline inspection monitor in FIGS. 3 to 5 can be formed.

The inline inspection of the semiconductor device 2 is conducted by using the inline inspection monitor 15 after the above described wafer process. More specifically, the inspection needles 19a and 19b are brought into contact with the barrier metals 10c and 10d as illustrated in FIG. 5, and a potential difference when a micro current is made to flow between the barrier metals 10c and 10d is measured so as to obtain sheet resistance of the P type layer 16. On the basis of this measurement result, an impurity diffusion layer of the semiconductor device 2 or workmanship of the contact hole of the inter-layer insulating film after completion of the wafer process is inspected/managed by electric measurement.

After the inline inspection, the semiconductor wafer 1 is diced along the dicing region 3, and a plurality of the semiconductor devices 2 are separated individually. At this time, as illustrated in FIG. 4, a portion from which the aluminum layer 11 has been removed is cut by the dicing blade 20 on the P type layer 16. By means of the above process, the semiconductor devices are manufactured.

In this embodiment, the measurement electrode of the inline inspection monitor 15 is formed of the barrier metals 10c and 10d, and the aluminum layer 11 is not left on the inline inspection monitor 15 in the dicing region 3 in the wafer process. As a result, biting of the aluminum layer 11 into the dicing blade can be eliminated and thus, defect of withstand voltage deterioration caused by chipping or cracks from the dicing region side can be reduced. Moreover, since there is no need to apply etching removal of the measurement electrode after the inline inspection, the manufacturing process can be simple.

In the prior-art inline inspection monitor, thick film aluminum was used for the measurement electrode. However, when sheet resistance and contact resistance in the impurity diffusion layer in silicon are to be measured, measurement can be made with a minute current, unlike the power chip portion used for large power applications. Therefore, the prior-art thick film aluminum is not required. However, when Ic (sat) or Vice (sat) of the IGBT is to be measured, for example, the thick film aluminum is preferably arranged, but a monitor capable of measurement with a minute current can be used instead.

Figure 11:
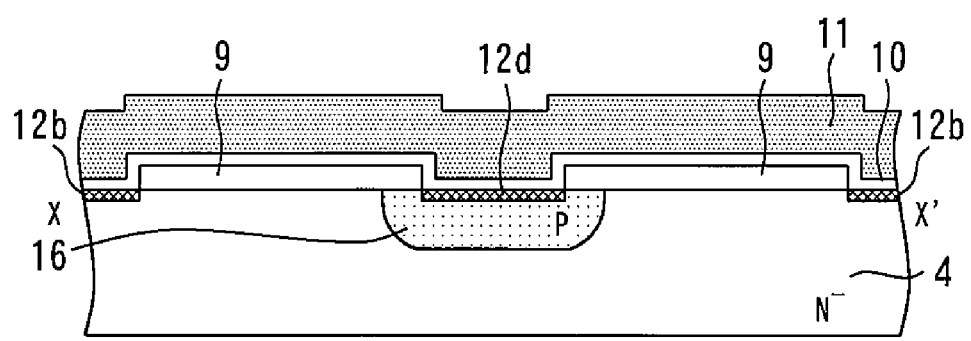
FIGS. 11 to 14 are sectional views illustrating variations of the manufacturing process of the inline inspection monitor according to embodiment 1 of the present invention.
Figure 12:
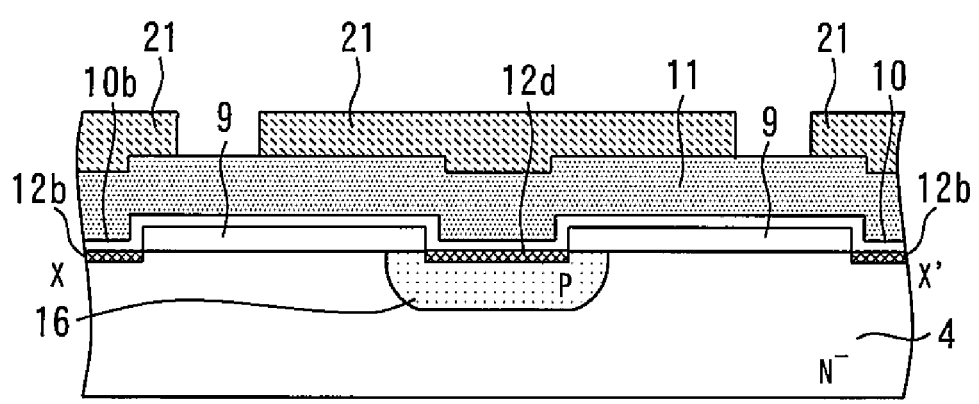
Figure 13:
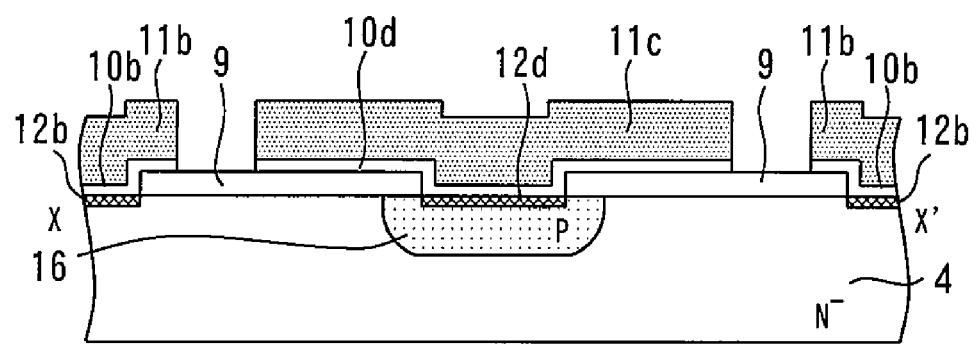
Figure 14:
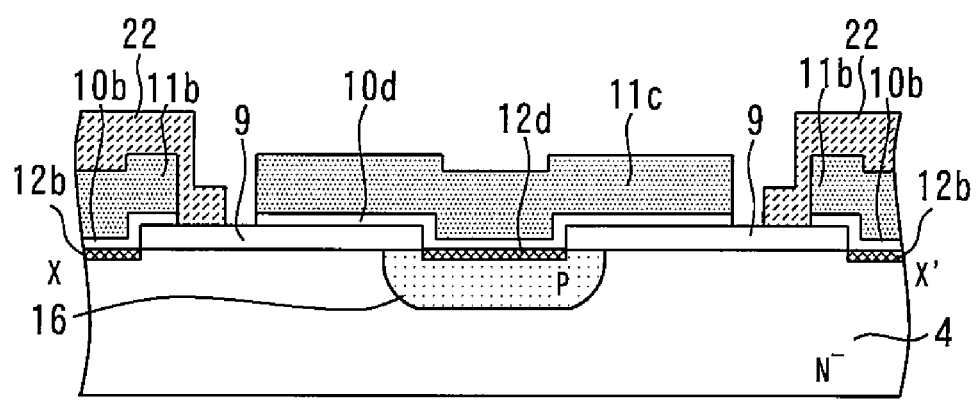

FIGS. 11 to 14 are sectional views illustrating variations of the manufacturing process of the inline inspection monitor according to embodiment 1 of the present invention. As illustrated in FIG. 6, after the barrier metal 10 and the silicides 12a to 12d are formed, the aluminum layer 11 is formed as illustrated in FIG. 11. Subsequently, as illustrated in FIG. 12, a resist 21 is formed on the aluminum layer 11 by using a photolithography process. Subsequently, as illustrated in FIG. 13, the aluminum layer 11 and the barrier metal 10 are etched by using the resist 21 as a mask, and the barrier metals 10a to 10d, the emitter electrode 11a, and the aluminum electrodes 11b and 11c are formed. After that, the resist 21 is removed. Subsequently, as illustrated in FIG. 14, a resist 22 is formed on the aluminum layer 11b which is a channel stopper electrode in the photolithography process. Only the aluminum layer 11c on the barrier metal 10d which is a measurement electrode is etched and removed by using this resist 22 as a mask. After that, the resist 22 is removed. In this manufacturing process, too, the inline inspection monitor in FIGS. 3 to 5 can be formed.

Embodiment 2

Figure 15:
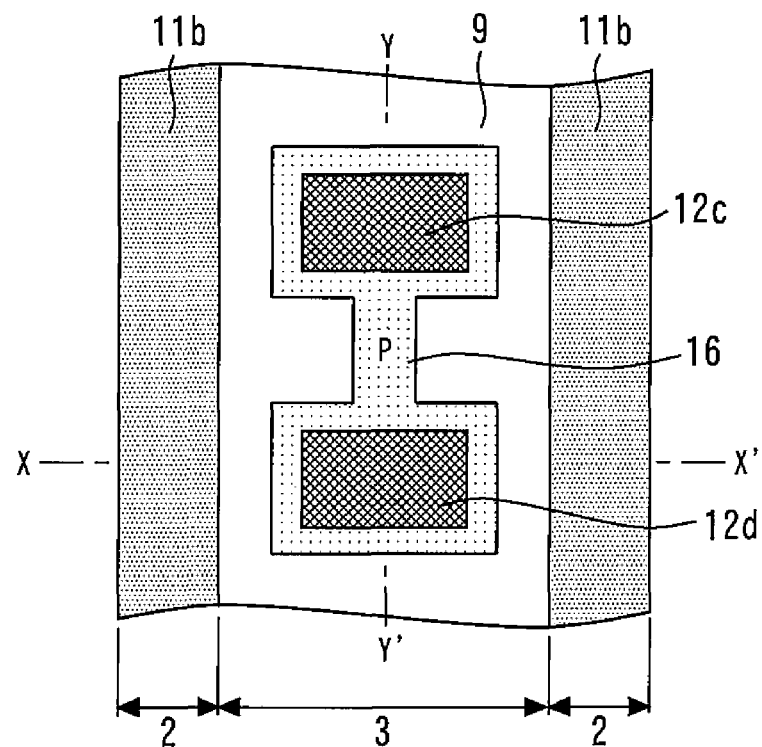
FIG. 15 is a top view illustrating an inline inspection monitor according to Embodiment 2 of the present invention.
Figure 16:
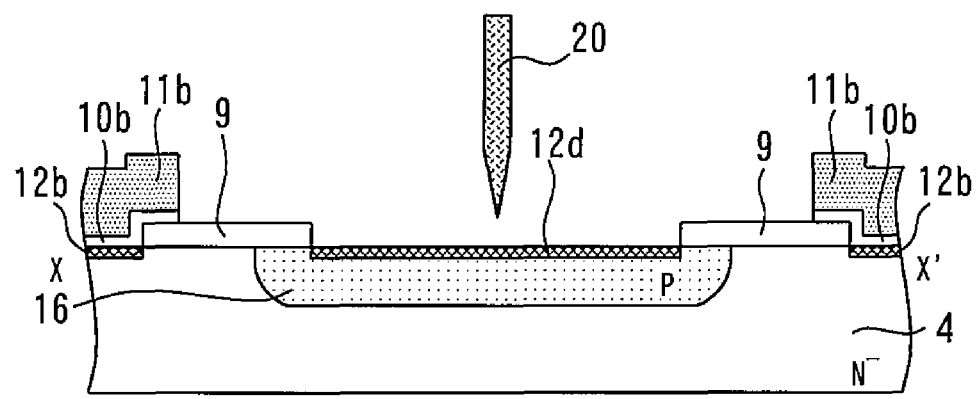
FIG. 16 is a sectional view along X-X' in FIG. 15.
Figure 17:
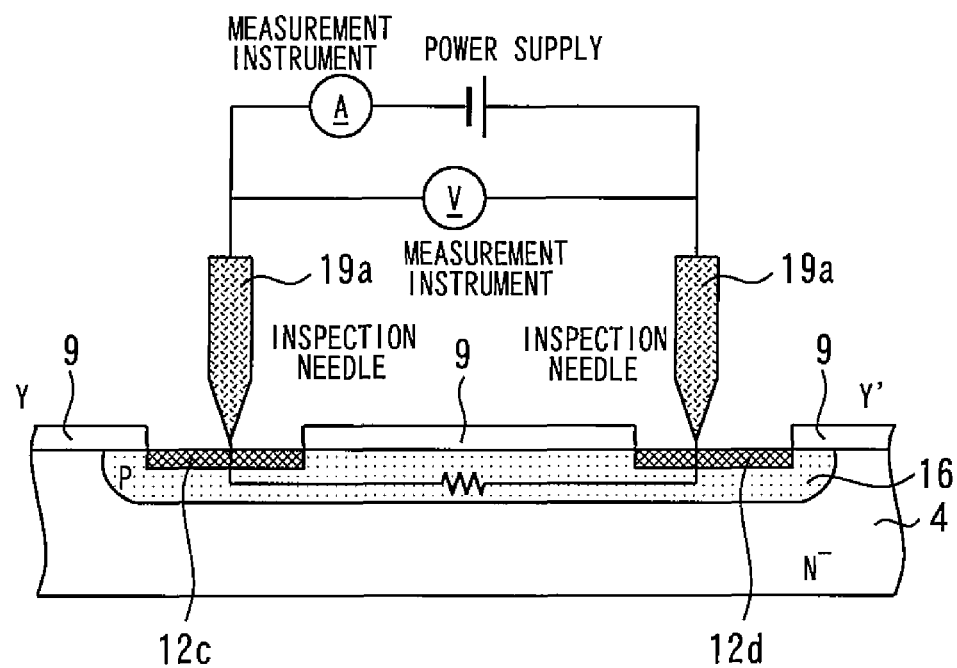
FIG. 17 is a sectional view along Y-Y' in FIG. 15.

FIG. 15 is a top view illustrating an inline inspection monitor according to Embodiment 2 of the present invention. FIG. 16 is a sectional view along X-X' in FIG. 15, and FIG. 17 is a sectional view along Y-Y' in FIG. 15. This inline inspection monitor is different from the inline inspection monitor 15 in Embodiment 1 in a point that no barrier metal 10c or 10d is provided. When an inline inspection is to be conducted, the inspection needles 19a and 19b are brought into contact with the silicides 12c and 12d, respectively.

Figure 18:
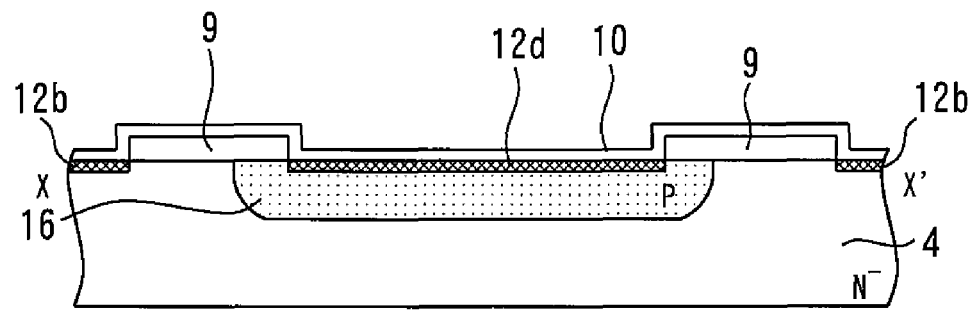
FIGS. 18 to 20 are sectional views illustrating the manufacturing process of the inline inspection monitor according to Embodiment 2 of the present invention.
Figure 19:
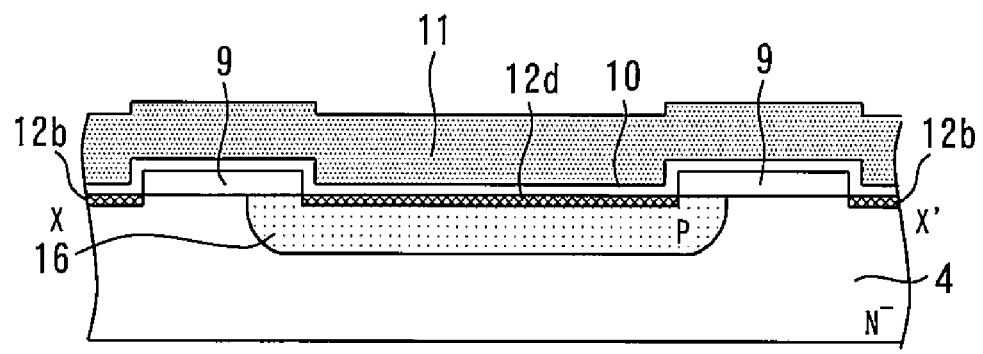
Figure 20:
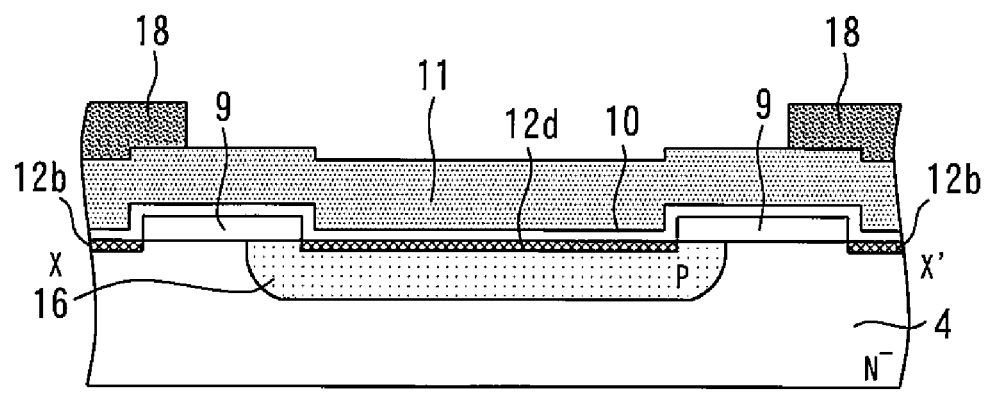

FIGS. 18 to 20 are sectional views illustrating the manufacturing process of the inline inspection monitor according to Embodiment 2 of the present invention. These views correspond to the sectional views along X-X' in FIG. 15. First, as illustrated in FIG. 18, the P type layer 16 is formed on the N-type substrate 4. The inter-layer insulating film 9 is formed, and a contact hole is formed in the inter-layer insulating film 9 above the edge termination end portion and the P type layer 16 of the semiconductor device 2. The barrier metal 10 is formed over the whole surface. The silicides 12b to 12d are formed between the barrier metal 10 and the N− type substrate 4 as well as the P type layer 16 by RTA treatment. Subsequently, as illustrated in FIG. 19, the aluminum layer 11 is formed. Subsequently, as illustrated in FIG. 20, the resist 18 is formed on the aluminum layer 11 in the photolithography process in a region where the channel stopper electrode is to be formed. The aluminum layer 11 is etched by using this resist 18 as a mask. After that, the resist 18 is removed. By means of this manufacturing process, the inline inspection monitor in FIGS. 15 to 17 can be formed.

In this embodiment, too, the aluminum layer 11 is not left on the inline inspection monitor 15 of the dicing region 3 in the wafer process similarly to Embodiment 1. As a result, biting of the aluminum layer 11 into the dicing blade can be eliminated, and thus, a defect of withstand voltage deterioration caused by chipping or cracks from the dicing region side can be reduced. Also, since there is no need to etch and to remove the measurement electrode after the inline inspection, the manufacturing process is simple. Moreover, since the inline inspection after completion of the wafer process can be basically replaced by a monitor capable of measurement with a minute current, the silicides 12c and 12d can be used as measurement electrodes.

Moreover, in the manufacturing method of this embodiment, the number of photo masks in the photolithography process can be reduced by one sheet as compared with Embodiment 1, and the number of wafer processes can be reduced, and thus, a throughput of the wafer process can be improved.

The dimension of the contact hole becomes the dimensions of the silicides 12c and 12d and hence, the dimension of the measurement electrode for inline inspection monitor. Thus, the contact hole in the inter-layer insulating film 9 in the dicing region 3 should have an area required for contact by the inspection needles 19a and 19b in the inline inspection. Moreover, since the silicides 12c and 12d are formed on the P type layer 16, the P type layer 16 needs to formed larger than the contact hole.

Embodiment 3

Figure 21:
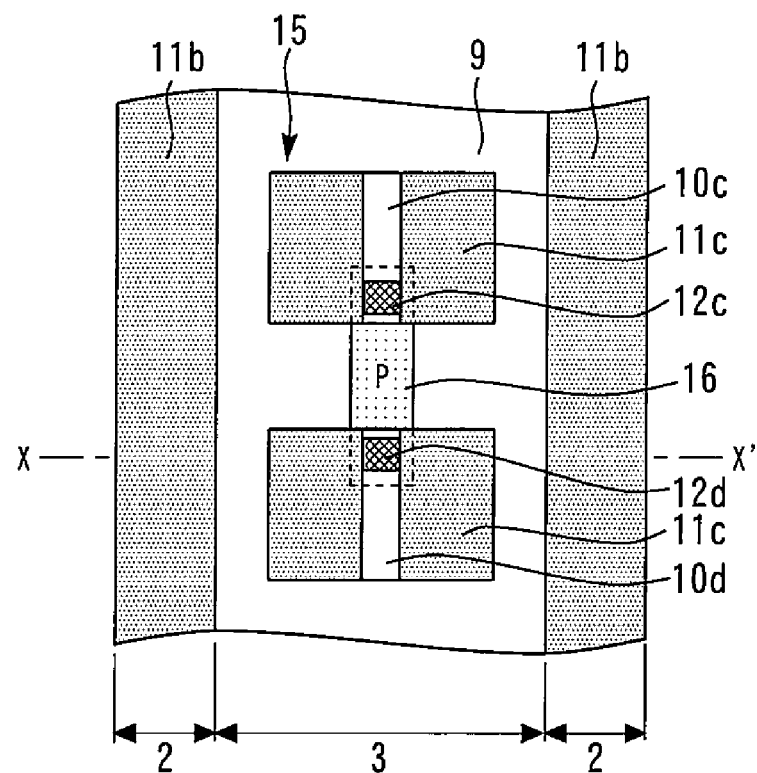
FIG. 21 is a top view illustrating an inline inspection monitor according to Embodiment 3 of the present invention.
Figure 22:
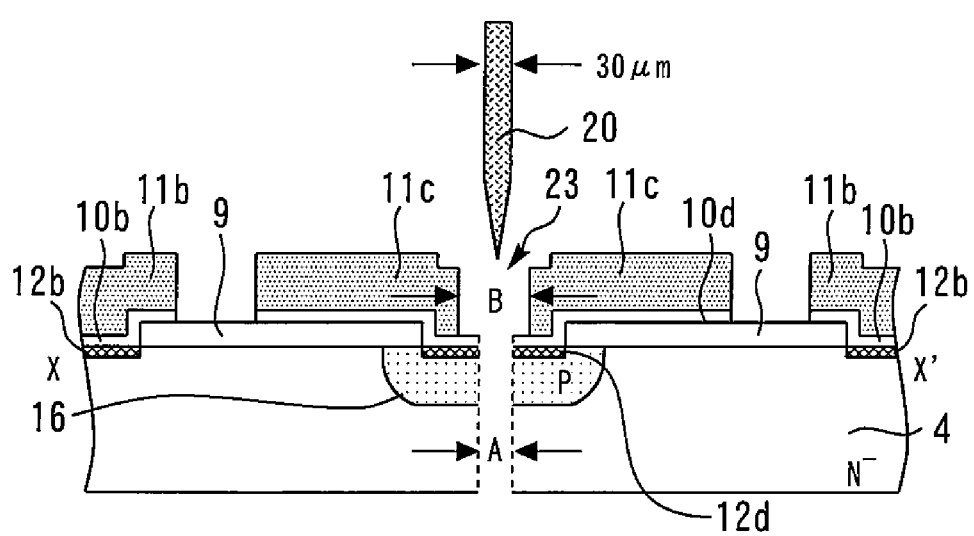
FIGS. 22 and 23 are sectional views along X-X' in FIG. 21.
Figure 23:
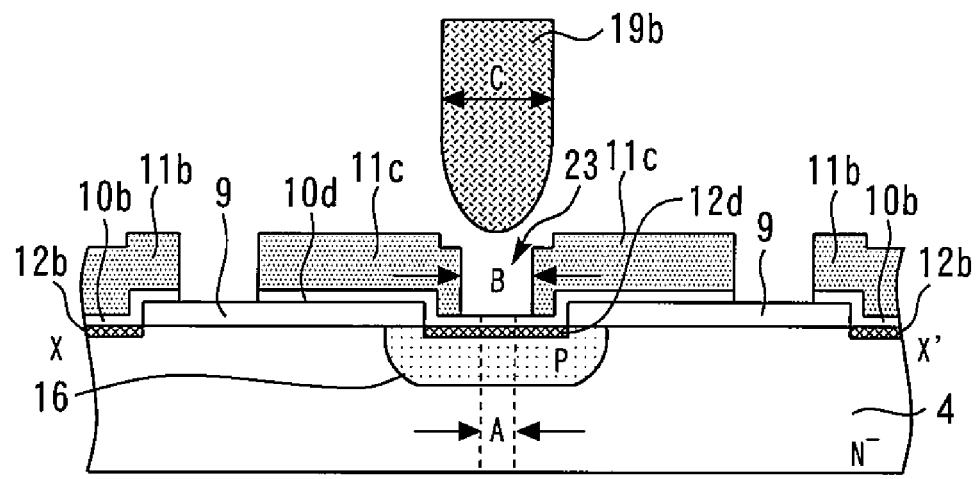

FIG. 21 is a top view illustrating an inline inspection monitor according to Embodiment 3 of the present invention. FIGS. 22 and 23 are sectional views along X-X' in FIG. 21. The aluminum electrode 11c which is a measurement electrode of the inline inspection monitor 15 has a groove 23 through which the dicing blade 20 passes.

As a manufacturing process, as illustrated in FIGS. 12 and 13, the aluminum layer 11 is patterned and separated to the aluminum electrodes 11b and 11c arranged on the P type base layer 5 and the P type layer 16, respectively. Therefore, this aluminum electrode 11c is formed at the same time as the emitter electrode 11a of the semiconductor device 2 with the same thickness. Then, the groove 23 is formed in the aluminum electrode 11c by removing a part of the aluminum electrode 11c.

When the inline inspection is to be conducted, the inspection needles 19a and 19b are brought into contact with the aluminum electrode 11c. Then, when the semiconductor wafer 1 is to be diced, the portion of the groove 23 is cut by the dicing blade 20. As a result, since biting of the aluminum layer into the dicing blade 20 can be eliminated, a defect of withstand voltage deterioration caused by chipping or cracks from the dicing region side can be reduced. Moreover, since there is no need to etch and remove the measurement electrode after the inline inspection, the manufacturing process is simple.

Reference character A denotes a dicing width in dicing using the dicing blade 20, reference character B denotes a width of the groove 23 of the aluminum electrode 11c which is an electrode for measurement, and reference character C denotes a diameter of each of the inspection needles 19a and 19b of the inline inspection. For example, if the width of the dicing blade 20 is 30 µm and position accuracy of the dicing blade 20 is $\alpha$ µm, 30+$\alpha$ µm should be ensured as the dicing width A. Therefore, the width B of the groove 23 of the aluminum electrode 11c which is the measurement electrode needs to be set larger than 30+$\alpha$ µm. Moreover, the width B of the groove 23 needs to be made smaller than the diameter C of each of the inspection needles 19a and 19b so that the inspection needles 19a and 19b are not brought into direct contact with the barrier metals 10c and 10d.

Moreover, since the power semiconductor device tends to have a thinner film for reduction of a power loss, mechanical strength of the wafer lowers. Thus, when the inspection needles 19a and 19b are brought into physical contact with the barrier metals 10c and 10d as in Embodiment 1, the inspection needles 19a and 19b pierce silicon, and thus, accurate measurement cannot be made, and it is likely that a crack, a split of a wafer or the like occurs. On the other hand, in this embodiment, the inspection needles 19a and 19b are brought into contact with the thick aluminum electrode 11c, and aluminum works as a buffer material.

Figure 24:
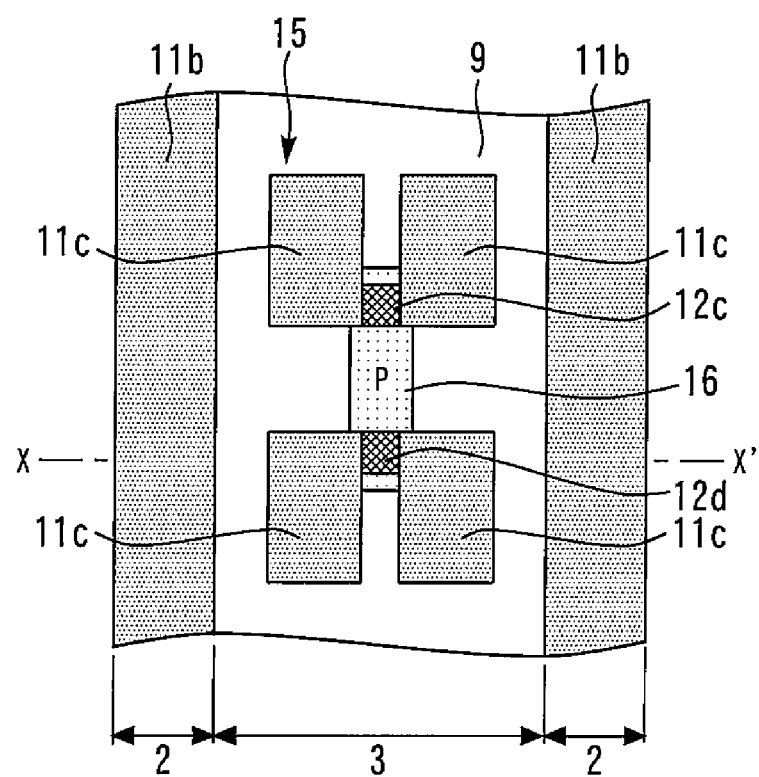
FIG. 24 is a top view illustrating a variation of the inline inspection monitor according to Embodiment 3 of the present invention.
Figure 25:
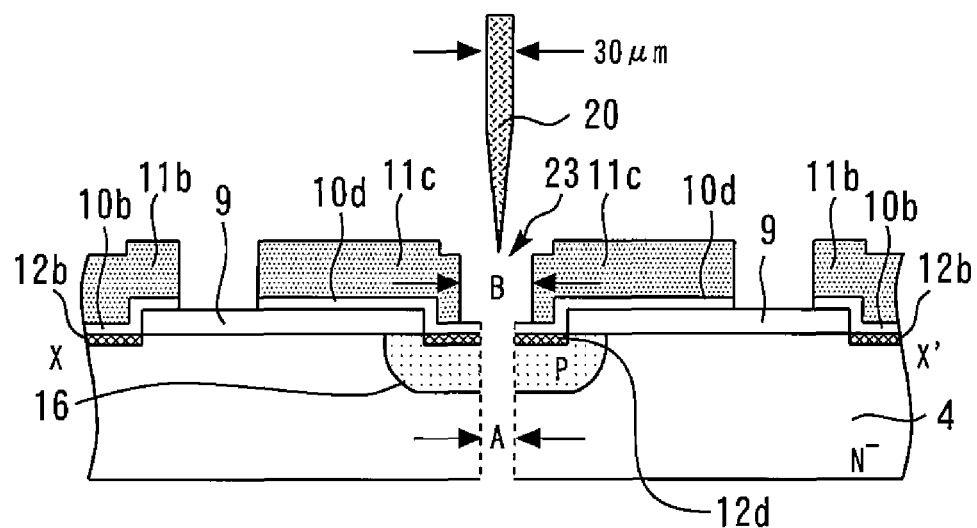
FIGS. 25 and 26 are sectional views along X-X' in FIG. 24.
Figure 26:
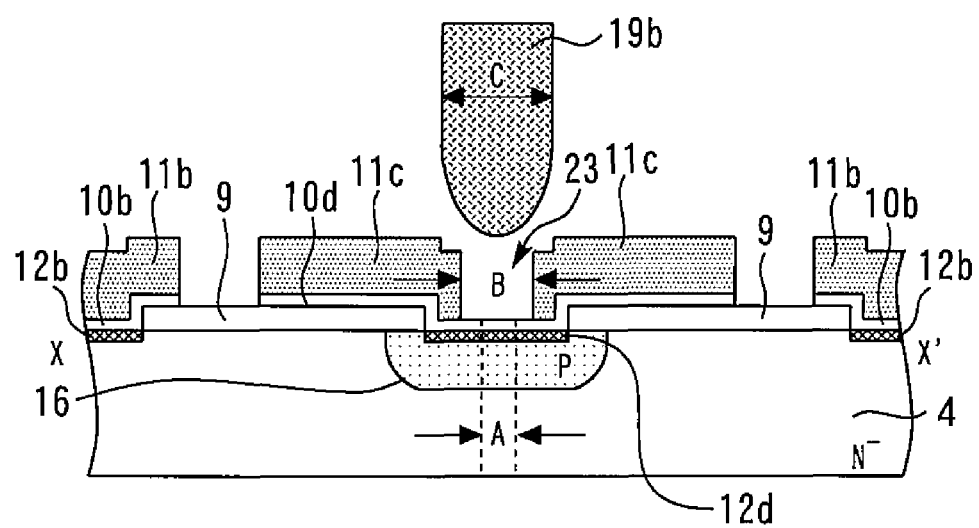

FIG. 24 is a top view illustrating a variation of the inline inspection monitor according to Embodiment 3 of the present invention. FIGS. 25 and 26 are sectional views along X-X' in FIG. 24. In the groove 23 of the aluminum electrode 11c of the inline inspection monitor 15, the barrier metals 10c and 10d are removed. As a result, the number of photo masks can be reduced by one sheet in the photolithography process similarly to Embodiment 2, and since the number of wafer processes can be reduced, a throughput of the wafer process can be improved.

The semiconductor device may be formed of not only silicon but also of a wide band-gap semiconductor having a band gap wider than that of silicon. The wide band-gap semiconductor includes silicon carbide, gallium nitride materials or diamond, for example.

The semiconductor device formed of such wide band-gap semiconductor has high voltage resistance or allowable current density and thus, the size can be reduced. By using this size-reduced semiconductor device, a size of a semiconductor module incorporating this semiconductor device can be also reduced. Moreover, since heat resistance of the semiconductor device is high, a size of a radiator fan of a heat sink can be reduced, and a water-cooling portion can be made air cooling, whereby the size of the semiconductor module can be further reduced. Moreover, since the semiconductor device has low power loss and high efficiency, efficiency of the semiconductor module can be improved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-017218, filed on Jan. 31, 2014 including specification, claims, drawings and summary, on which the Convention priority of the present application is based, is incorporated herein by reference in its entirety.

What is claimed is:

1. A method for manufacturing a semiconductor device comprising:
    forming a semiconductor wafer including a plurality of semiconductor devices sandwiching a dicing region and an inline inspection monitor arranged in the dicing region;
    after forming the semiconductor wafer, conducting an inline inspection of the semiconductor device by using the inline inspection monitor; and
    after the inline inspection, dicing the semiconductor wafer along the dicing region to separate the semiconductor devices individually,
    wherein the step of forming the semiconductor wafer includes:
    simultaneously forming a first diffusion layer of the semiconductor device and a second diffusion layer of the inline inspection monitor;
    forming a metal layer on the first and second diffusion layer; and
    at least partly removing the metal layer on the second diffusion layer while not removing the metal layer over portions of the first diffusion layer,
    when the semiconductor wafer is diced, a portion from which the metal layer has been removed is cut by a dicing blade on the second diffusion layer.

2. The method according to claim 1, wherein the step of forming the semiconductor wafer includes:
    before forming the metal layer, forming a barrier metal on the first and second diffusion layer; and
    separating the barrier metal into first and second barrier metals located on the first and second diffusion layers respectively, and
    when the inline inspection is to be conducted, an inspection needle is brought into direct contact with the second barrier metal.

3. The method according to claim 1, wherein the step of forming the semiconductor wafer includes a step of forming first and second silicides between the first and second diffusion layers and the metal layer respectively by thermal treatment, and
    when the inline inspection is to be conducted, an inspection needle is brought into direct contact with the second silicide.

4. A method for manufacturing a semiconductor device comprising:
    forming a semiconductor wafer including a plurality of semiconductor devices sandwiching a dicing region and an inline inspection monitor arranged in the dicing region;
    after forming the semiconductor wafer, conducting an inline inspection of the semiconductor device by using the inline inspection monitor; and
    after the inline inspection, dicing the semiconductor wafer along the dicing region to separate the semiconductor devices individually,
    wherein the step of forming the semiconductor wafer includes:
    simultaneously forming a first diffusion layer of the semiconductor device and a second diffusion layer of the inline inspection monitor;
    forming a metal layer on the first and second diffusion layer;

separating the metal layer into first and second metal layers located on the first and second diffusion layers respectively; and forming a groove in the second metal layer by removing a part of the second metal layer, when the inline inspection is to be conducted, an inspection needle is brought into contact with the second metal layer, and when the semiconductor wafer is diced, a portion of the groove is cut by the dicing blade.

5. The method according to claim 4, wherein a width of the groove is smaller than a diameter of the inspection needle and is larger than a width of the dicing blade.

\* \* \* \* \*